United States Patent [19]

Endo et al.

[11] Patent Number: 4,920,544
[45] Date of Patent: Apr. 24, 1990

[54] DELTA-SIGMA MODULATOR

[75] Inventors: Seiji Endo, Kawasaki; Osamu Kobayashi, Yokohama; Masatsugu Kamimura, Kobe, all of Japan

[73] Assignee: Fujitsu Limited, Kawasaki, Japan

[21] Appl. No.: 308,555

[22] Filed: Feb. 10, 1989

[30] Foreign Application Priority Data

Feb. 10, 1988 [JP] Japan .................................. 63-29291

[51] Int. Cl.⁵ ............................................ H04B 14/04
[52] U.S. Cl. ...................................... 375/26; 375/34; 341/143
[58] Field of Search ...................... 375/27, 28, 29, 33, 375/26, 34; 341/143, 155, 200; 332/11 D

[56] References Cited

U.S. PATENT DOCUMENTS

| | | | |
|---|---|---|---|
| 4,009,475 | 2/1977 | DeFreitas | 375/28 |
| 4,433,311 | 2/1984 | Noguchi et al. | 375/28 |
| 4,439,756 | 3/1984 | Shenoi et al. | 341/143 |
| 4,528,551 | 7/1985 | Agrawal et al. | 341/143 |
| 4,588,981 | 5/1986 | Senn | 341/143 |
| 4,772,871 | 9/1988 | Suzuki et al. | 375/28 |

FOREIGN PATENT DOCUMENTS 58-170115 10/1983 Japan .

OTHER PUBLICATIONS

Y. Matsuya et al., "SAMPLED-DATA ANALOG LOGIC", 1987 IEEE International Solid-State Circuits Conference, Feb. 1987, pp. 48-49.

Primary Examiner—Benedict V. Safourek
Assistant Examiner—Stephen Chin
Attorney, Agent, or Firm—Staas & Halsey

[57] ABSTRACT

The delta-sigma modulator includes a secondary delta-sigma modulator which carries out a secondary delta-sigma modulation for an analog input signal, thereby producing a first quantization signal. A quantization noise extractor extracts a quantization noise occurring in the secondary delta-sigma modulator. A primary delta-sigma modulator carries out a first delta-sigma modulator for the quantization noise, thereby producing a second quantization signal. A differentiating circuit differentiates the second quantization signal supplied from the primary delta-sigma modulator. An adder adds the first quantization signal and an output signal of the differentiating circuit, thereby producing a digital output signal corresponding to the analog input signal.

11 Claims, 6 Drawing Sheets

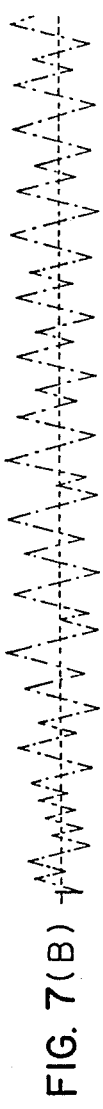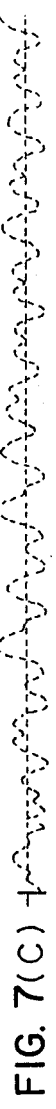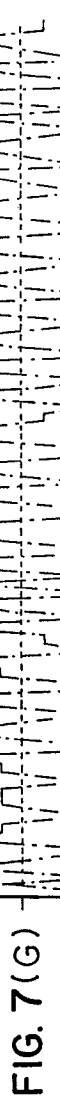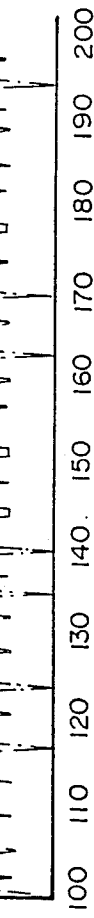
FIG. 7(A) FIG. 7(B) FIG. 7(C) FIG. 7(D) FIG. 7(E) FIG. 7(F) FIG. 7(G)

DELTA-SIGMA MODULATOR

FIELD OF THE INVENTION

The present invention generally relates to a delta-sigma modulator, and in particular to an analog-to-digital converter using a delta-sigma modulator. More particularly, the present invention relates to an analog-to-digital converter which has the tertiary transfer characteristic and equivalently functions as the triple integral type analog-to-digital converter.

BACKGROUND OF THE INVENTION

Recently, as digital communication networks and high quality digital audio systems are developed, there have been proposed increased applications of an analog-to-digital converter (hereafter simply referred to as an A/D converter) which converts an analog signal into a corresponding digital signal. On the other hand, as communication equipments and audio apparatuses have increased and improved functions, a requirement exists for providing A/D converters of small size, low power consumption, wide frequency range and high accuracy. In order to meet the above-mentioned requirement, A/D converters using delta-sigma modulators are being attracted.

The delta-sigma modulator has the basic structure of single integral type, which consists of a noise shaping processing portion and a 1-bit quantization portion. The single-integral type delta-sigma type modulator has the transfer characteristic defined by the following formula (1):

$$Dout = Ain + (1-z^{-1})Q \quad (1)$$

where Dout denotes a digital output signal, Ain denotes an analog input signal, and Q denotes a quantization noise. It is known that the secondary integral type delta-sigma modulator having the secondary transfer characteristic represented by formula (2) is obtainable by cascading two single-integral type delta-sigma modulators. Similarly, the triple integral type delta-sigma modulator having the tertiary transfer characteristic represented by formula (3) can be constructed by cascading three single-integral type delta-sigma modulators. It is also known that as an increased number of cascaded stages, the dynamic range of the modulator is improved, and therefore higher accuracy A/D converters can be realized.

$$Dout = Ain + (1-z^{-1})^2 Q \quad (2)$$

$$Dout = Ain + (1-z^{-1})^3 Q \quad (3)$$

On the other hand, when the number of single-integral type delta-sigma modulators is simply increased, circuit operation thereof becomes instable, and designed characteristics are not obtained with stability. From this viewpoint, currently, there has been considerable activity in the development of triple integral type A/D converters which have the tertiary transfer characteristic and exhibit stable operation.

However, as is described in detail layer, the conventional triple integral type A/D converters have the disadvantage in that a number of structural elements are necessary to construct the same. This prevents integration of A/D converters. Additionally, the use of a number of structural elements leads to deterioration of the signal-to-noise (S/N) ratio and dynamic range. From the above-mentioned viewpoints, it is desired to provide A/D converters (modulators) having the tertiary transfer characteristic by using a decreased number of structural parts.

SUMMARY OF THE INVENTION

It is therefore a general object of the present invention to provide a novel and useful delta-sigma modulator in which the aforementioned disadvantages of the present invention are eliminated.

A more specific object of the present invention is to provide a delta-sigma modulator which makes it possible to provide an A/D converter having the tertiary transfer characteristic constructed by a reduced number of parts.

Another object of the present invention is to provide a delta-sigma modulator having an improved dynamic range and making it possible to facilitate integration of A/D converters.

The above objects of the present invention can be achieved by a delta-sigma modulator including the following elements. A secondary delta-sigma modulator carries out a secondary delta-sigma modulation for an analog input signal, thereby producing a first quantization signal. A quantization noise extractor extracts a quantization noise occurring in the secondary delta-sigma modulator. A primary delta-sigma modulator carries out a first delta-sigma modulation for the quantization noise, thereby producing a second quantization signal. A differentiating circuit differentiates the second quantization signal supplied from the primary delta-sigma modulator. An adder adds the first quantization signal and an output signal of the differentiating circuit, thereby producing a digital output signal corresponding to the analog input signal.

Other objects, features and advantages of the present invention will become apparent from the following detailed description when read in conjunction with the accompanying drawings.

BRIEF DESCRIPTION OF THE DRAWINGS

FIG. 7 is a view illustrating waveforms of voltage signals observed at different nodes in the circuit of FIG. 4.

DETAILED DESCRIPTION

Figure 1:
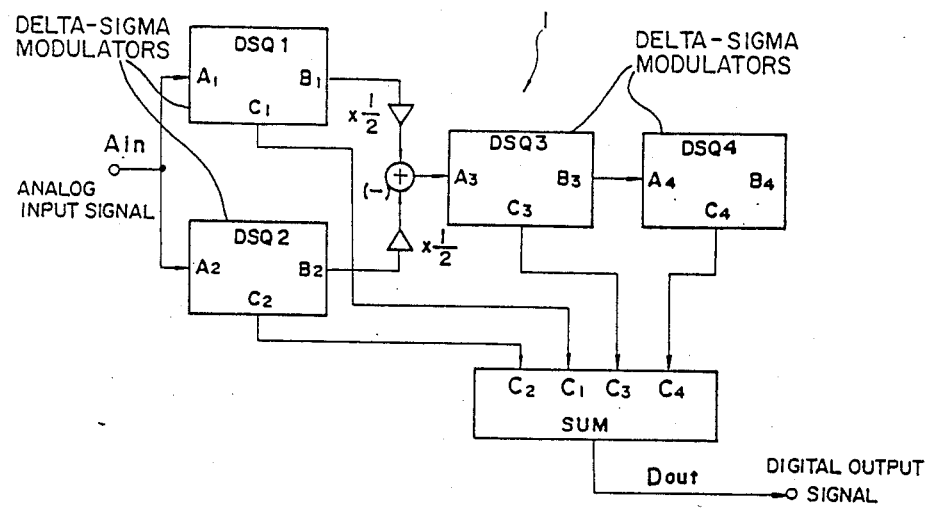
FIG. 1 is a block diagram of an example of conventional A/D converters.
Figure 2:
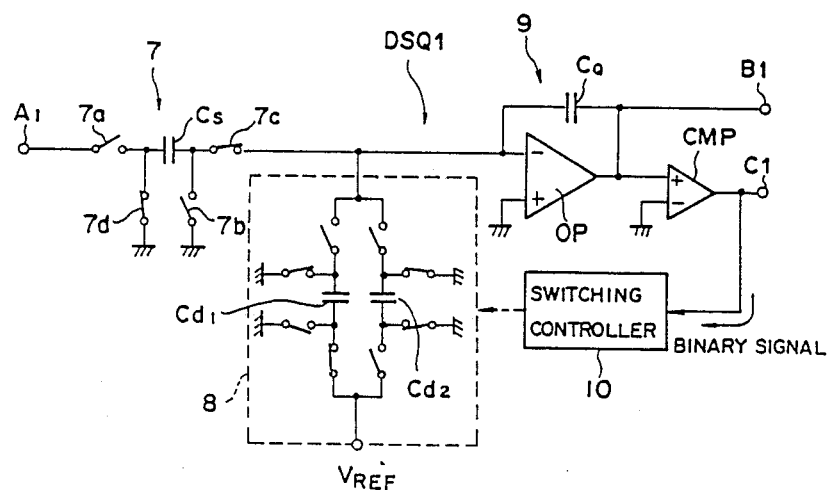
FIG. 2 is a circuit diagram of the delta-sigma modulator DSQ1 used in the A/D converter of FIG. 1.

To facilitate the understanding of the present invention, a description is given of the conventional triple integral type A/D converter with reference to FIGS. 1 and 2.

Referring to FIG. 1, an A/D converter 1 includes four delta-sigma modulators DSQ1 through DSQ4 of the same structure, and has three cascaded stages. Hereafter, delta-sigma modulators DSQ1 through DSQ4 are simply referred to as modulators DSQ1 through DSQ4. The first stage is constituted by the modulators DSQ1 and DSQ2 arranged so as to provide the difference circuit. The second stage is constituted by the modulator DSQ3, which is followed by the third stage constituted by the modulator DSQ4.

FIG. 2 shows the structure of the modulator DSQ1. The other modulators DSQ2 through DSQ4 have the structure identical to that shown in FIG. 2. The modulator DSQ1 has a first charge input circuit 7 of a switched capacitor circuit including switches $7a$, $7b$, $7c$ and $7d$, and a capacitor Cs. The switches $7a$ and $7b$ are closed during a predetermined sampling period, so that an instantaneous amplitude value of an analog input signal Ain applied to an input terminal A1 can be stored in the capacitor Cs. Thereafter, the switches $7a$ and $7b$ are made open and, at the same time, the switches $7c$ and $7d$ are closed. At this time, the charge stored in the capacitor Cs is read out therefrom. A second charge input circuit 8 of the switched capacitor type is connected to the first charge input circuit 7. Illustrated switches of the second charge input circuit 8 are made open and closed in accordance with binary signals described later so that capacitors Cd1 and the Cd2 are charged up to a reference voltage $V_{REF}$, and are then discharged to transfer a subtracter shown in FIG. 1.

An integrator 9 includes an integration capacitor $C_Q$ and an operational amplifier OP, and integrates the instantaneous amplitude value supplied from the charge input circuit 7 and the potential supplied from the second charge input circuit 8. The output of the integrator 9 is supplied to the next stage through an output terminal B1, and is applied to a positive input terminal (non-inverting input terminal) of a comparator CMP. The comparator CMP compares the output of the integrator 9 with a voltage value of zero volt applied to a negative input terminal (inverting input terminal) thereof. The comparison result is represented in the form of the binary signal indicating binary "1" or "0", and is outputted through an output terminal C1. The comparison result is also supplied to a switch controller 10, which controls the switches in the second charge input circuit 8 in accordance with the value of the binary signal. That is, the potential at the negative input terminal of the operational amplifier OP is fed back to the second charge input circuit 8 in accordance with the binary signal.

Turning to FIG. 1, the binary signals supplied from the modulators DSQ1 through DSQ4 has been provided with the following transfer characteristics:

$$DSQ1: C1 = Ain + (1 - z^{-1})B1 \quad (4)$$

$$DSQ2: C2 = Ain - (1 - z^{-1})B2 \quad (5)$$

$$DSQ3: C3 = -\tfrac{1}{2}(B1 + B2) + (1 - z^{-1})B3 \quad (6)$$

$$DSQ4: C4 = -B3 + (1 - z^{-1})B4 \quad (7)$$

The binary signals C1 to C4 are summed by a summation circuit SUM, the output of which is supplied, as the digital output signal Dout, to an external circuit.

The summing logic of the summation circuit SUM is given by the following formula:

$$Dout = \tfrac{1}{2}(C1 - C2) + (1 - z^{-1})C3 + (1 - z^{-1})^2 C4 \quad (8)$$
$$= Ain + (1 - z^{-1})^3 C4$$

It can be seen that formula (8) represents the tertiary transfer characteristic identical to that for the triple integral type delta-sigma modulator. As a result, with the structure of FIG. 2, it is possible to obtain the dynamic range equivalent to the triple integral type. In addition, in each of the delta-sigma modulators DSQ1 to DSQ4, the feedback loop for the binary signal is completed. For these reasons, the stability of circuit operation is considerably high.

However, the above-mentioned conventional A/D converter has the following disadvantages. The comparators CMPs for use in quantization must be provided for respective delta-sigma modulators DSQ1 to DSQ4. That is, the example of FIG. 1 requires four comparators CMPs. This leads to an increase in circuit size, and prevents integration. Further, an increased number of elements may cause deterioration in the S/N ratio. From the viewpoint of dynamic range in addition to the above-mentioned viewpoints, it is desired that the number of parts is as small as possible.

Figure 3:
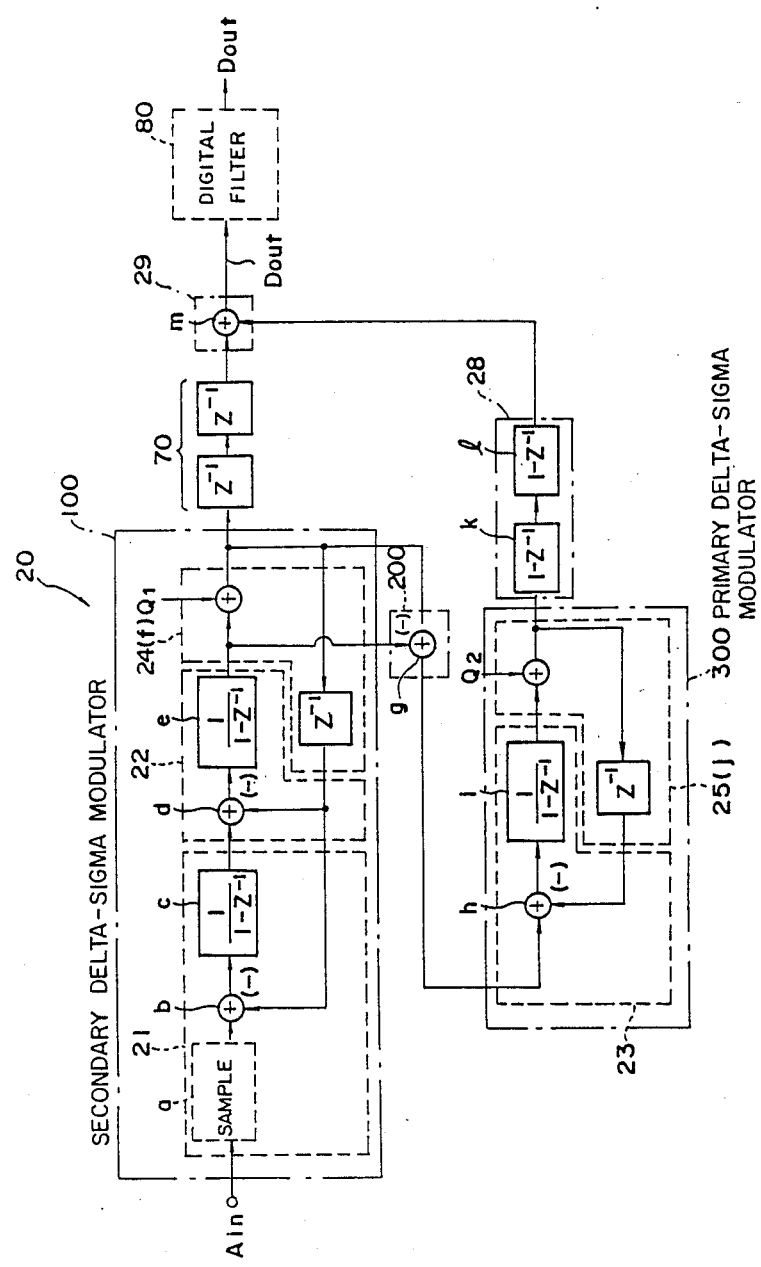
FIG. 3 is a circuit diagram of an embodiment of the present invention.

A description is given of a preferred embodiment of the present invention with reference to FIG. 3. An A/D converter 20 of the present embodiment includes a secondary delta-sigma modulator 100, a quantization noise extractor 200, a primary delta-sigma modulator 300, a differentiating circuit 28, and an adding circuit 29. The secondary delta-sigma modulator 100 includes first-, and second-stage integral circuits 21 and 22, and a first comparator 24. The primary delta-sigma modulator 300 includes a third-stage integral circuit 23, and a second comparator 25.

With respect to the secondary delta-sigma modulator 100, a sampling circuit 'a' included in the first-stage integral circuit 21, samples an analog input signal Ain at a frequency higher than the highest frequency of the analog input signal Ain. The first-stage integral circuit 21 also includes a first subtracter 'b', and a first integrator 'c'. The first subtracter 'b' subtracts a first feedback signal supplied from the first comparator 24 from the input signal Ain. The first integrator 'c' integrates an output signal of the first subtracter 'b'. The second-stage integral circuit 22 includes a second subtracter 'd' and a second integrator 'e'. The second subtracter 'd' subtracts the first feedback signal from an output signal of the first integrator 'c'. The second integrator 'e' integrates an output signal of the second subtracter 'd'. The first comparator 24 functions as a first quantizer 'f'. The first quantizer 'f' produces a first quantization signal by quantizing an output signal of the second integrator 'e' at a predetermined sampling frequency, and feeds the produced first quantization signal back to the first- and second-stage integral circuits 21 and 22, as the first feedback signal, through a unit delay element.

The quantization noise extractor 200 comprises a third subtracter 'g', to which there are supplied the output signal of the second-stage integrator 22 and the first quantization signal derived from the first quantizer 'f'. An output signal of the third subtracter 'g' represents a quantization error introduced in the first quantizer.

The primary delta-sigma modulator includes a third-stage integral circuit 23 and a second comparator 25. The third-stage integral circuit 23 comprises a fourth subtracter 'h', and a third integrator 'i'. The fourth subtracter 'h' subtracts a second feedback signal from the quantization noise signal of the third subtracter 'g'. The second feedback signal is supplied from the second quantizer 'j'. The third integrator 'j' integrates an output signal of the fourth subtracter 'h'. The second comparator 25 functions as a second quantizer 'j', which produces a second quantization signal by sampling an output signal of the third integrator 'i' at a predetermined sampling frequency, and feeds the second quantization signal back to the fourth subtracter 'h' as the second feedback signal through a unit delay element.

The differentiating circuit 28 consists of first and second differentiating circuits 'k' and 'l'. The first differentiating circuit 'k' differentiates the second quantization signal supplied from the second quantizer 'j'. The second differentiating circuit 'l' differentiates an output signal of the first differentiating circuit 'k'. The adding circuit 29 adds an output signal of the differentiating circuit 'l' to the first quantization signal which has been delayed by a delay circuit 70 including two delay elements connected in series. The delay circuit is used for fitting, on the time axis, the first quantization signal into the two times differentiated second quantization signal. The added result of the adding circuit 29, which is a digital output signal Dout, is supplied to a conventional digital filter 80, which produces a finalized digital output signal $D_{OUT}$.

The embodiment of FIG. 3 constructed by two quantizers 'f' and 'j' equivalently functions as the triple-integral type A/D converter having the tertiary transfer characteristic. The output F of the first quantizer 'f' can be represented by the following formula (9):

$$F = Ain + (1-z^{-1})^2 Q1 \quad (9)$$

where Q1 denotes quantization noise occurring in the first quantizer 'f', and $z^{-1}$ denotes the unit delay operator. The first quantizer 'f' functions as the comparator, the operation of which is represented as follows;

$$F = Ain + Q1 \quad (10)$$

The third subtracter 'g' calculates the difference between the input and output signals of the first quantizer f, the output signal of the third subtracter 'g' becomes −Q corresponding to (Ain−F). Therefore, the output signal J of the second quantizer 'j' is represented as follows:

$$J = -Q1 + (1-z^{-1})Q2 \quad (11)$$

where Q2 denotes quantization noise occurring in the second quantizer 'j'. The output signal J of the second quantizer 'j' is differentiated two times by the differentiating circuit 28. The following formula (12) represents the output signal J' of the differentiating circuit 28:

$$\begin{aligned} J' &= (1-z^{-1})^2 J \\ &= -(1-z^{-1})^2 Q1 + (1-z^{-1})^3 Q2 \end{aligned} \quad (12)$$

The adding circuit 29 adds the signals J' and F, and produces the digital output signal Dout represented by the following formula:

$$J' + F = Ain + (1+z^{-1})^3 Q2 \quad (13)$$

It can be seen from formula (13) that the triple integral type delta-sigma modulator having the tertiary transfer characteristic is equivalently obtained.

It should be appreciated that the present embodiment is constructed by only two quantization stages (comparators). In other words, the triple integral type delta-sigma modulator can be constructed by the number of comparators half that for the conventional delta-sigma modulator already described with reference to FIGS. 1 and 2. Therefore, it becomes possible to reduce the circuit size. Further, the feedback loops are completed within the respective quantization stages. As a result, according to the present invention, the stabilized circuit operation and wide dynamic range are obtainable.

Figure 4:
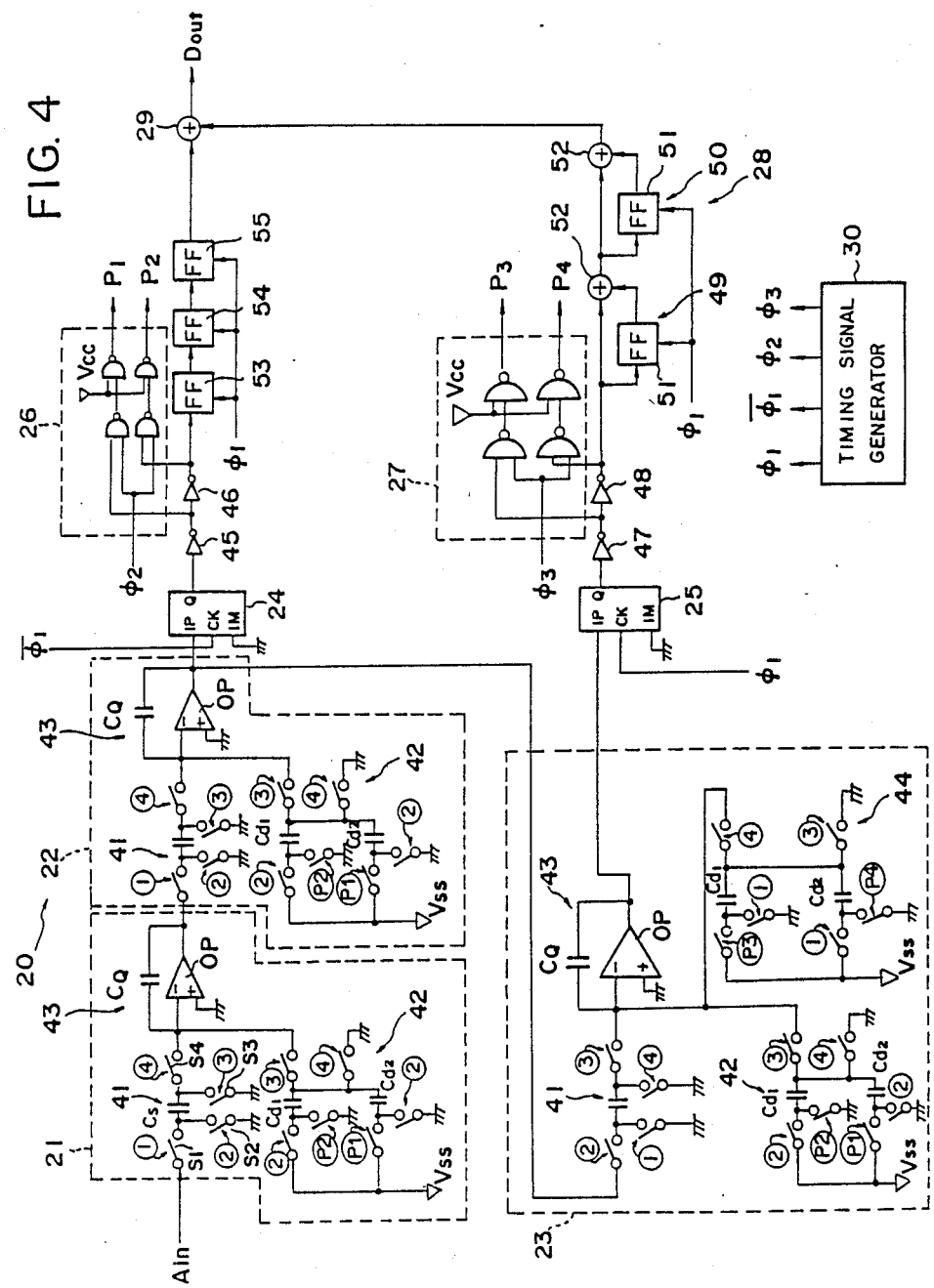
FIG. 4 is a detailed circuit diagram of the embodiment of FIG. 3.
Figure 5:
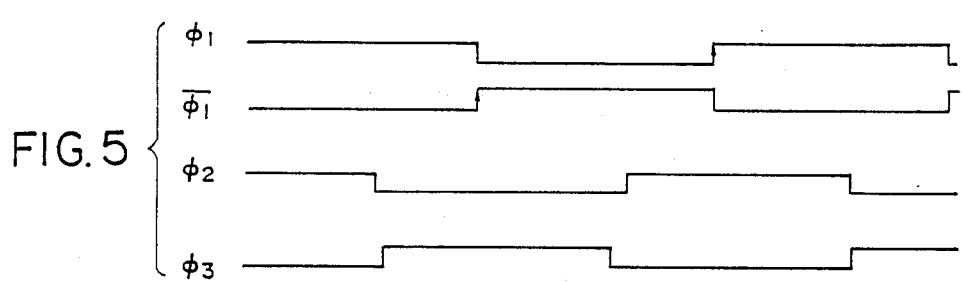
FIG. 5 is a view illustrating waveforms of timing signal used in the embodiment shown in FIG. 4.

A description is given of the detailed circuit configuration of the A/D converter 20 of FIG. 3, by referring to FIG. 4. In addition to the parts shown in FIG. 3, the embodiment includes first and second switching controllers 26 and 27, and a timing signal generator 30. The timing signal generator 30 generates a plurality of timing signals necessary for the A/D converter 20. Those examples of the timing signals are shown in FIG. 5, in which timing signals $\phi_1$, $\overline{\phi}_1$, $\phi_2$ and $\phi_3$ are illustrated.

The first-stage integral circuit 21 functions as the sampling circuit 'a', the first subtracter 'b', and the first integrator 'c'. The first-stage integral circuit 21 consists of two charge input circuits 41 and 42, and an integrator 43. The charge input circuit 41 is constituted by a switched capacitor circuit, and includes a capacitor Cs, and four switches S1 through S4 connected around the capacitor Cs. Numerals ①  to ④ are attached to the switches S1 to S4, respectively. In FIG. 4, switches having the same numerals are kept in the same state. The switches S1 and S3 are paired, and switch S2 and S4 are paired. The pair of switches always has the same ON/OFF states. One of the two pairs of switches is ON (closed), the other pair is OFF (open). The ON/OFF operation of each switch is alternatively carried out. Thereby, the analog input signal Ain is sampled at the fixed sampling period. The sampled instantaneous amplitude value is stored in the capacitor Cs, and is then read out therefrom at the predetermined time.

The charge input circuit 42 generates the first feedback signal supplied from the first quantizer f shown in FIG. 3. It is noted that the first-stage integral circuit 21 is not coupled directly with the first quantizer by using an actual line as shown in FIG. 3. However, the charge input circuit 42 produces the first feedback signal as if it is actually supplied thereto from the first quantizer 'f' through the line. This is because the charge input circuit 42 is controlled by timing signals generated based on the first quantization signal, as described later. The charge input circuit 42 includes switches to which numerals ②, ③ and ④ are attached, and switches Ⓟ1 and Ⓟ2. Switch control signals P1 and P2 described later are supplied to and control the switches Ⓟ1 and Ⓟ2, respectively. Further, the charge input circuit 42 includes capacitors Cd1 and Cd2. A potential Vss is actually set equal to zero volt. A symbol of ground shown in FIG. 4 has a potential of approximately 2.5 volts. When the ground potential is considered as the reference potential, the potential Vss is considered as a negative potential. The signal line on which the signal Ain is transferred, has the maximum potential Vcc equal to approximately 5 volts. Therefore, the signal line change within a range of approximately 0 to 5 volts. The capacitors Cd1 and Cd2 are set to the potential Vss, for example, by instructions defined by the combinations of the switch control signals P1 and P2. Then, the charges stored in the capacitors Cd1 and Cd2 are read out therefrom, and are applied, at a predetermined time, to the inverting input of an operational amplifier OP, which is a part of the integrator 43. As a result, the inverting terminal of the operational amplifier OP is supplied with both the sampling data signal supplied from the charge input circuit 41 and the potential set by the charge input circuit 42, or the charged-up potential. At the inverting terminal, the charged-up potential is subtracted from the sampled data signal. By changing combinations of the switch control signals P1 and P2, it is possible to increase or decrease the charged-up potential. It is noted that the charged-up potential represents the magnitude (binary "1" or "0") of the first quantization the magnitude (binary "1" or "0") of the first quantization signal, because the switch control signals P1 and P2 are produced from the output signal of the first comparator 24. It follows that the charged-up potential provided by the capacitors Cd1 and Cd2 functions as the first feed-back signal with respect to the first quantization signal.

The integral circuit 43 is the known circuit which consists of a capacitor CQ and the operational amplifier OP, which integrates the sampling data signal applied to the inverting terminal thereof.

The second-stage integral circuit 22 has the same structure as the first-stage integral circuit 21, and functions as the second subtracter 'd' and the second integrator 'e'.

The third-stage integral circuit 23 functions as the third and fourth subtracters 'g', and 'h', and the third integrator 'k', and includes a charge input circuit 44 in addition to the charge input circuits 41 and 42. In principle of the present invention, it may be considered that the third subtracter 'g' is separated from the third-stage integral circuit 23, as shown in FIG. 3. However, in the actual circuit configuration of FIG. 4, the third and fourth subtracters 'g' and 'h' are coupled directly with the input terminal of the integrator 43. For this reason, in FIG. 4, the third subtracter 'g' is described as one of the components of the third-stage integrator 23. The charge input circuit 44 includes switches ③ and ④ controlled by switch controls signals P3 and P4 described later in addition to switches labeled ①, ③ and ④. The cooperative function provided by charge input circuit 41 and the second charge input circuit 42 corresponds to the function of the third subtracter 'g'. The charge input circuit 44 corresponds to the feedback loop on which the second quantization signal is transmitted.

The first comparator 24 functions as the first quantizer 'f', and compares the potentials of terminals IP and IM thereof in synchronism with the rise of the timing signal $\phi_1$. The terminal IM of the comparator 24 is supplied with the ground potential, and the terminal IP is supplied with the output signal of the second-stage integral circuit 22. Then, the first comparator 24 produces the first quantization signal though a Q terminal thereof. Since the first comparator 24 operates in response to the clock signal $\phi_1$, it is considered that the unit delay element shown in FIG. 3 is included in the comparator 24.

The second comparator 25 functions as the second quantizer 'j', and compares the potentials of terminals IP and IM thereof in synchronism with the rise of the timing signal $\phi_1$. The terminal IP is supplied with the output signal of the third-stage integral circuit 23, and the terminal IM is supplied with the ground potential. Then, the second comparator 25 produces the second quantization signal through a Q-terminal thereof.

The first quantization signal derived from the first comparator 24 passes through inverters 45 and 46. The first switch controller 26 receives the output signals of the inverters 45 and 46, and produces the switch control signals P1 and P2. As illustrated in FIG. 4, the switch controller 26 consists of four NAND gates. During the time when the timing signal $\phi_2$ is kept at high ("H") level, either one of the switch control signals P1 and P2 is set to high ("H") level in accordance with the combination of the output signals of the inverters 45 and 46. As described previously, the switch control signals P1 and P2 are served as signals for controlling switches to which references ⓟ1 and ⓟ2 are attached, respectively. For example, when the switch control signal P1 is "H", the corresponding switches are closed.

The second quantization signal supplied from the Q-terminal of the second comparator 25 passes through inverters 47 and 48. The second switch controller 27 receives output signals of the inverters 47 and 48. As shown in FIG. 4, the second switch controller 27 includes four NAND gates. The second switch controller 27 produces the switch control signals P3 and P4 in synchronism with the timing signal $\phi_3$. When the timing signal is kept at "H" level, either one of the control signals P3 and P4 are kept "H" in accordance with the combination of the output signals of the inverters 47 and 48. As described previously, the switch control signals P3 and P4 are served as signals for controlling switches to which references P3 and P4 are attached. For example, when the switch control signal P3 is "H", the corresponding switches are closed.

The differentiating circuit 28 includes the first and second differentiating portions 49 and 50 which are cascaded. Each of the first and second differentiating portions 49 and 50 includes a D-type flip-flop portion ("FF") 51 and 52, which operate in synchronism with the timing signal $\phi_1$.

Figure 6:
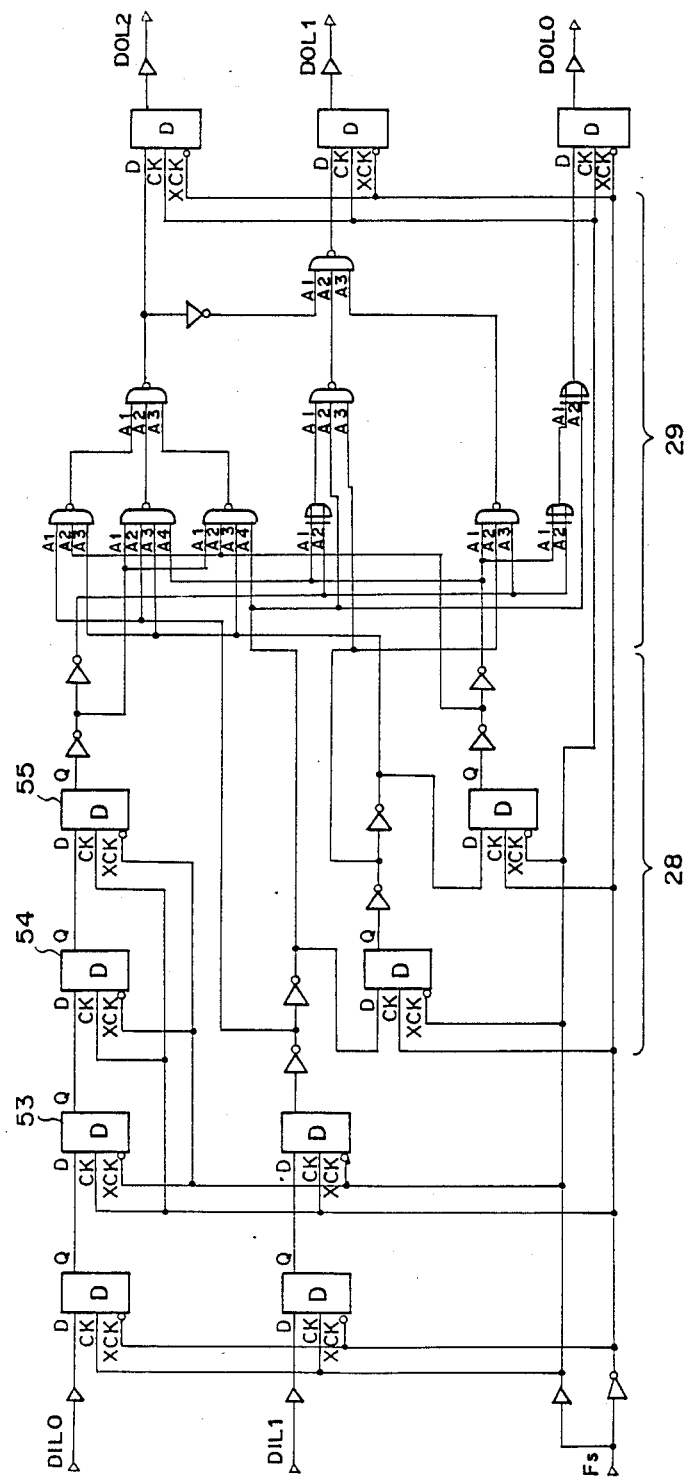
FIG. 6 is a circuit diagram of a differentiating circuit shown in FIG. 4.

FIG. 6 shows the circuit configuration including the differentiating circuit 28 and the adder 29. DIL0 is the first quantization signal derived from the first comparator 24, and DIL1 is the second quantization signal derived from the second comparator 25. Each of the first and second quantization signals DIL0 and DIL1 is a one-bit digital signal. Fs is the timing signal $\phi_1$. The first quantization signal DIL0 is supplied to the adder 29 through the D-type flip-flops ("FF") 53, 54 and 55. As shown, the adder 29 is constructed by logic elements such as NAND gates and inverters. The second quantization signal IDL1 is supplied to the differentiating circuit 28 constructed by D-type flip-flops and logic elements such as NAND gates and inverters. The adder 29 produces the digital output signal Dout consisting of three digits DOL0 through DOL2.

FIG. 7 shows voltage signal waveforms obtained at different nodes in the circuit of FIG. 4. The horizontal axis indicates time, and the vertical axis represents signal waveforms. FIG. 7(A) illustrates the waveform of the analog input signal Ain of a sine wave of a frequency equal to 1 kHz. FIGS. 7(B) and 7(C) illustrate waveforms of the output signals of te first- and second-stage integral circuits 21 and 22, respectively. FIG. 7(D) illustrates the waveform of the output signal of the first comparator 24, which is the digital signal. FIG. 7(E) illustrates the waveform of the output signal of the third-stage integral circuit 23. FIG. 7(F) illustrates the waveform of the output signal of the second comparator 25, which is the digital signal. FIG. 7(G) illustrates the digital output signal Dout.

The adding circuit 29 functions as the adder 'm', and adds the first quantization signal which has been delayed by 2.5D through D-type flip-flops 53, 54 and 55, and the second quantization signal which has been differentiated two times through the differentiating circuit 28. Then, the added result, or the digital output signal Dout is supplied to the digital filter 80 shown in FIG. 3.

The output signal F of the second-stage integral circuit 22 is given by the aforementioned formula (9), which represents the secondary transfer characteristic. The digital output signal Dout is given by the aforementioned formula (13). The transfer characteristic of the A/D converter 20 corresponds to that of the A/D converter based on the triple integral type delta-sigma modulator, and therefore provides the equivalent dynamic range. Further, since the quantization is carried out by two stages of the first and second comparators 24 and 25, it is possible to reduce the circuit size. Moreover, since the feedback loop is provided with respect to each of the first and second quantization signals, the stabilized circuit operation can be obtained.

Figure 8:
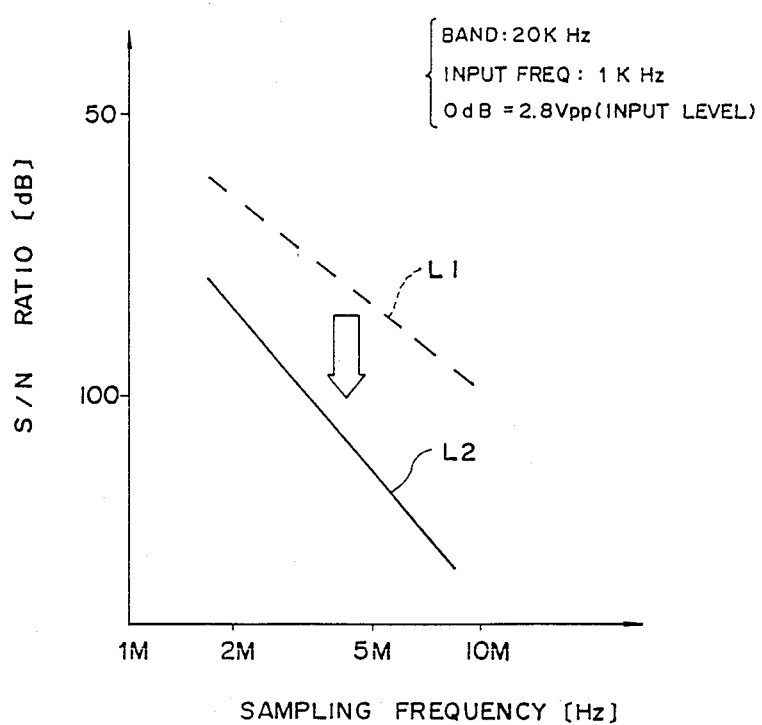
FIG. 8 is a graph showing the relationship between sampling frequencies and S/N ratio with respect to the conventional secondary delta-sigma modulator and the present invention.

As described above, according to the present invention, it is possible to equivalently obtain the tertiary transfer characteristic which corresonds to that of the triple integral type. Therefore, the improved dynamic range can be obtained. FIG. 8 is a graph showing the results of simulation conducted by the present inventors, in which the horizontal axis represents the sampling frequency (Hz), and the vertical axis represents the S/N ratio (dB). In the simulation, the frequency range was set to 20 kHz, and the input signal frequency was set to 1 kHz. In the graph, 0 dB amounts to a peak-to-peak voltage of 2.8 volts. The illustrated solid line L2 represents the S/N ratio provided by the A/D converter of the present invention, and the broken line L1 is concerned with the conventional secondary delta-sigma modulator. It can be seen from the graph that an improvement in S/N ratio amounting to 25 dB is obtained by the present invention.

The present invention is not limited to the above-mentioned embodiments, and variations and modification may be made without departing from the scope of the present invention.

What is claimed is:

1. A delta-sigma modulator comprising:
secondary delta-sigma modulation means for carrying out a secondary delta-sigma modulation for an analog input signal, thereby producing a first quantization signal;
quantization noise extracting means for extracting a quantization noise occurring in said secondary delta-sigma modulation means;
primary delta-sigma modulation means for carrying out a first delta-sigma modulation for said quantization noise, thereby producing a second quantization signal;
differentiating means for differentiating said second quantization signal supplied from said primary delta-sigma modulation means; and
adding means for adding said first quantization signal and an output signal of said differentiating means, thereby producing a digital output signal corresponding to said analog input signal.

2. A delta-sigma modulator as claimed in claim 1, wherein the secondary delta-sigma modulation means comprises first- and second-stage integral circuits cascaded, and a first quantizer having an input terminal connected to said second-stage integral circuit and said quantization noise extracting means, and an output terminal connected to said quantization noise extracting means.

3. A delta-sigma modulator as claimed in claim 2, wherein said quantization noise extracting means comprises a subtracter having a first input terminal connected to the input terminal of said first quantizer, and a second input terminal connected to the output terminal of said first quantizer.

4. A delta-sigma modulator as claimed in claim 1, wherein said differentiating means comprises first and second differentiating portions which are cascaded.

5. A delta-sigma modulator as claimed in claim 1, further comprising delay means for delaying said first quantization signal by a predetermined time so as to fit, on the time axis, said first quantization signal into the output signal of said differentiating means.

6. A delta-sigma modulator as claimed in claim 2, wherein said secondary delta-sigma modulation means comprises corresponding switched capacitor means, and said delta-sigma modulator further comprises switch control means for generating switch control signals to be supplied to said switched capacitor means by using said first quantization signal.

7. A delta-sigma modulator as claimed in claim 1, wherein said primary delta-sigma modulator means comprises switched capacitor means, and said delta-sigma modulator further comprises switch control means for generating switch control signals to be supplied to said switched capacitor means by using said second quantization signal.

8. A delta-sigma modulator as claimed in claim 1, said first quantization signal derived from said secondary delta-sigma modulation means has the following transfer characteristic:

$$F = Ain + (1-z^{-1})^2 Q1$$

where F is said first quantization signal, Ain is said analog input signal, Q1 denotes said quantization noise, and $z^{-1}$ denotes a unit delay.

9. A delta-sigma modulator as claimed in claim 8, wherein said second quantization signal derived from said primary delta-sigma modulator has the following transfer characteristic:

$$J = -Q1 + (1-z^{-1})Q2$$

where J is the second quantization signal, Q2 is a quantization noise occurring in said primary delta-sigma modulator.

10. A delta-sigma modulator as claimed in claim 9, wherein the output signal of said differentiating means has the following transfer characteristic:

$$\begin{aligned} J' &= (1-z^{-1})^2 J \\ &= -(1-z^{-1})^2 Q1 + (1-z^{-1})^3 Q2 \end{aligned}$$

where J' is the output of said differentiating means.

11. A delta-sigma modulator as claimed in claim 10, wherein the digital output signal derived from said adding means has the following transfer characteristic:

$$J' + F = Ain + (1+z^{-1})^3 Q2.$$

* * * * *

UNITED STATES PATENT AND TRADEMARK OFFICE
CERTIFICATE OF CORRECTION

PATENT NO. : 4,920,544
DATED : April 24, 1990
INVENTOR(S) : Seiji ENDO et al.

It is certified that error appears in the above-identified patent and that said Letters Patent is hereby corrected as shown below:

On the title page:

[73] Assignee: after "Japan" add --and Fujitsu Ten Limited, Kobe, Japan--.

Col. 1, line 62, change "layer" to --later--;

Col. 3, line 12, change "the" to --a--;
line 58, equation (5), change "Ain" to -- - Ain--.

Col. 6, line 23, change "$\phi_1$" (second occurrence) to --$\overline{\phi}_1$--;
line 44, change "f" to --'f'--.

Col. 7, line 15, delete entire line (since duplicate of line 16);
lines 56 and 62, in each, change "$\phi_1$" to --$\overline{\phi}_1$--.

Signed and Sealed this

Eighteenth Day of June, 1991

*Attest:*

HARRY F. MANBECK, JR.

*Attesting Officer*      *Commissioner of Patents and Trademarks*